(12) United States Patent
Christo et al.

(10) Patent No.: US 10,303,838 B2
(45) Date of Patent: May 28, 2019

(54) DYNAMIC IMPEDANCE NET GENERATION IN PRINTED CIRCUIT BOARD DESIGN

(71) Applicant: International Business Machines Corporation, Armonk, NY (US)

(72) Inventors: Michael A. Christo, Round Rock, TX (US); David L. Green, Austin, TX (US); Julio A. Maldonado, Austin, TX (US); Diana D. Zurovetz, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/612,032

(22) Filed: Jun. 2, 2017

(65) Prior Publication Data

US 2018/0349543 A1    Dec. 6, 2018

(51) Int. Cl.
    *G06F 17/50*    (2006.01)

(52) U.S. Cl.
    CPC ...... *G06F 17/5077* (2013.01); *G06F 17/5081* (2013.01)

(58) Field of Classification Search
    CPC .................. G06F 17/5077; G06F 17/5081
    See application file for complete search history.

(56) References Cited

U.S. PATENT DOCUMENTS 5,270,642 A     12/1993  Parker
5,502,644 A      3/1996  Hamilton et al.
8,572,840 B2 *  11/2013  Christo ............... H05K 1/0263
                                                          174/262

(Continued)

FOREIGN PATENT DOCUMENTS

JP       2014093340 A    5/2014
KR     1020000045926 A   7/2000
KR     1020100008948 A   1/2010

OTHER PUBLICATIONS

Huang et al., Technique to Improve the Accuracy of Mixed-mode S-parameters Derived from Single-Ended Results and Application to Shorter Test Coupon Design, Electromagnetic Compatibility and Signal Integrity, IEEE Symposium on. IEEE, 2015, pp. 283-288.

(Continued)

*Primary Examiner* — Vuthe Siek
(74) *Attorney, Agent, or Firm* — Lieberman & Brandsdorfer, LLC

(57) ABSTRACT

Dynamic electronic printed circuit board (PCB) design is provided. A test net on a PCB is dynamically created utilizing a first rule defining a net parameter and a second rule defining a padstack geometric parameter. A first evaluation of one or more nets having a first padstack is performed against the first rule. A second evaluation of both the first padstack and a reference padstack determined to be adjacently positioned to the first padstack is performed against the second rule. Based on the evaluations, a potential test net having a potential test padstack is dynamically selected from the evaluated nets. The selected potential test net is dynamically transformed into the test net. The dynamic transformation includes modifying the potential test padstack and/or the reference padstack utilizing the second rule. The dynamic creation of the test net improves the efficiency of electronic PCB design by mitigating time and footprint consumption.

18 Claims, 8 Drawing Sheets

(56) References Cited

U.S. PATENT DOCUMENTS

| | | | |
|---|---|---|---|
| 8,664,541 B2 * | 3/2014 | Andresen | H05K 1/114 174/267 |
| 8,759,689 B2 * | 6/2014 | Chan | H05K 1/0231 174/260 |
| 9,433,092 B2 * | 8/2016 | Feng | H05K 1/111 |
| 2007/0222473 A1 | 9/2007 | Eto | |

OTHER PUBLICATIONS

Anonymous, Circuit Board Test Points, ip.com, IPCOM000225086D, Jan. 23, 2013, pp. 1-4.
Bogatin et al., Field Solvers and PCB Stack up Analysis: Comparing Measurements and Modeling, Proceedings of the IPC PCB Expo, Long Beach, CA, Apr. 1998, pp. 1-6.

* cited by examiner

DYNAMIC IMPEDANCE NET GENERATION IN PRINTED CIRCUIT BOARD DESIGN

BACKGROUND

The present embodiments relate to printed circuit board design. More specifically, the embodiments relate to dynamically creating an impedance test net.

Various electronic products are configured with a printed circuit board (PCB). The PCB mechanically and electrically supports component(s) which provide functionality to an electronic product. The PCB may be configured to electrically support a desired functionality. The electrical support includes a conductive track, a pad, a vertical interconnect access (VIA), and/or other features which interconnect the component(s). In order to properly design the PCB, multiple factors have to be considered. The factors may be functionality of an element, configuration of the element, functionality of the PCB, configuration of the PCB, etc.

Computer aided design (CAD) software may be utilized by a PCB designer to support design of the PCB which conforms to the multiple factors. The CAD software represents different component(s) as digital object(s) having a physical shape and corresponding connection requirements. The design process starts with defining PCB parameters such as functionality, component(s) to be supported, quantity of layers, and/or size. The PCB design process positions the component(s) on the PCB utilizing the CAD software. A dataset comprising one or more networks of connections (e.g., a net) is created from the defined functionality and/or component(s). Each net describes connectivity of pins in the PCB corresponding to connections on the component(s) assigned to the net. A single net provides similar electrical support to all pins within the net. During design of the PCB, each net is provided with interconnections connecting all pins of the net by a wire(s) (e.g., conductive trace) and/or a VIA while avoiding overlap with a wire and/or a VIA of a second net. Each net has to be designed in accordance with the factors in order to assure the PCB will operate properly.

SUMMARY

A system, computer program product, and method are provided for dynamic creation of an impedance test net.

In one aspect, a system for dynamic electronic printed circuit board (PCB) design is provided with a processor in communication with memory and a design tool, also referred to herein as a tool. The tool obtains rules, including a first rule that defines a net parameter and a second rule that defines a padstack geometric parameter. The tool functions to dynamically create a test net on a PCB utilizing both the first and second rules. The dynamic creation includes the tool to perform a first evaluation of one or more nets having a first padstack on the PCB against the first rule. The tool also performs a second evaluation of both the first padstack and a reference padstack determined to be adjacently positioned to the first padstack against the second rule. Based on the first and second evaluations, the tool dynamically selects a potential test net from the one or more nets, with the potential test net having a potential test padstack. The tool dynamically transforms the selected potential test net into the test net. This dynamic transformation includes a modification of the potential test padstack and/or the reference padstack utilizing the second rule.

In another aspect, a computer program product is provided for dynamic electronic PCB design. The computer program product includes a computer readable storage device with embodied program code that is configured to be executed by a processor. Program code obtains first and second rules, with the first rule defining a net geometric parameter and the second rule defining a padstack geometric parameter. The program code dynamically creates a test net on a PCB utilizing both the first and second rules. The dynamic creation includes the program code to perform a first evaluation of one or more nets having a first padstack on the PCB against the first rule. The program code performs a second evaluation of both the first padstack and a reference padstack determined to be adjacently positioned to the first padstack against the second rule. Based on the first and second evaluations, program code dynamically selects a potential test net from the one or more nets, with the potential test new having a potential test padstack. Program code dynamically transforms the selected potential test net into the test net. The dynamic transformation includes modification of the potential test padstack and/or the reference padstack utilizing the second rule.

In yet another aspect, a method is provided for dynamic electronic PCB design. The method employs at least two rules, including a first rule that defines a net parameter and a second rule that defines a padstack geometric parameter. A test net on a PCB is dynamically created utilizing the first and second rules. The dynamic creation includes performing a first evaluation of one or more nets having a first padstack on the PCB against the first rule. A second evaluation of both the first padstack and a reference padstack, determined to be adjacently positioned to the first padstack, is performed against the second rule. Based on the first and second evaluations, a potential test net having a potential test padstack is dynamically selected and transformed into the test net. The dynamic transformation includes modifying the potential test padstack and/or the reference padstack utilizing the second rule.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Figure 1:
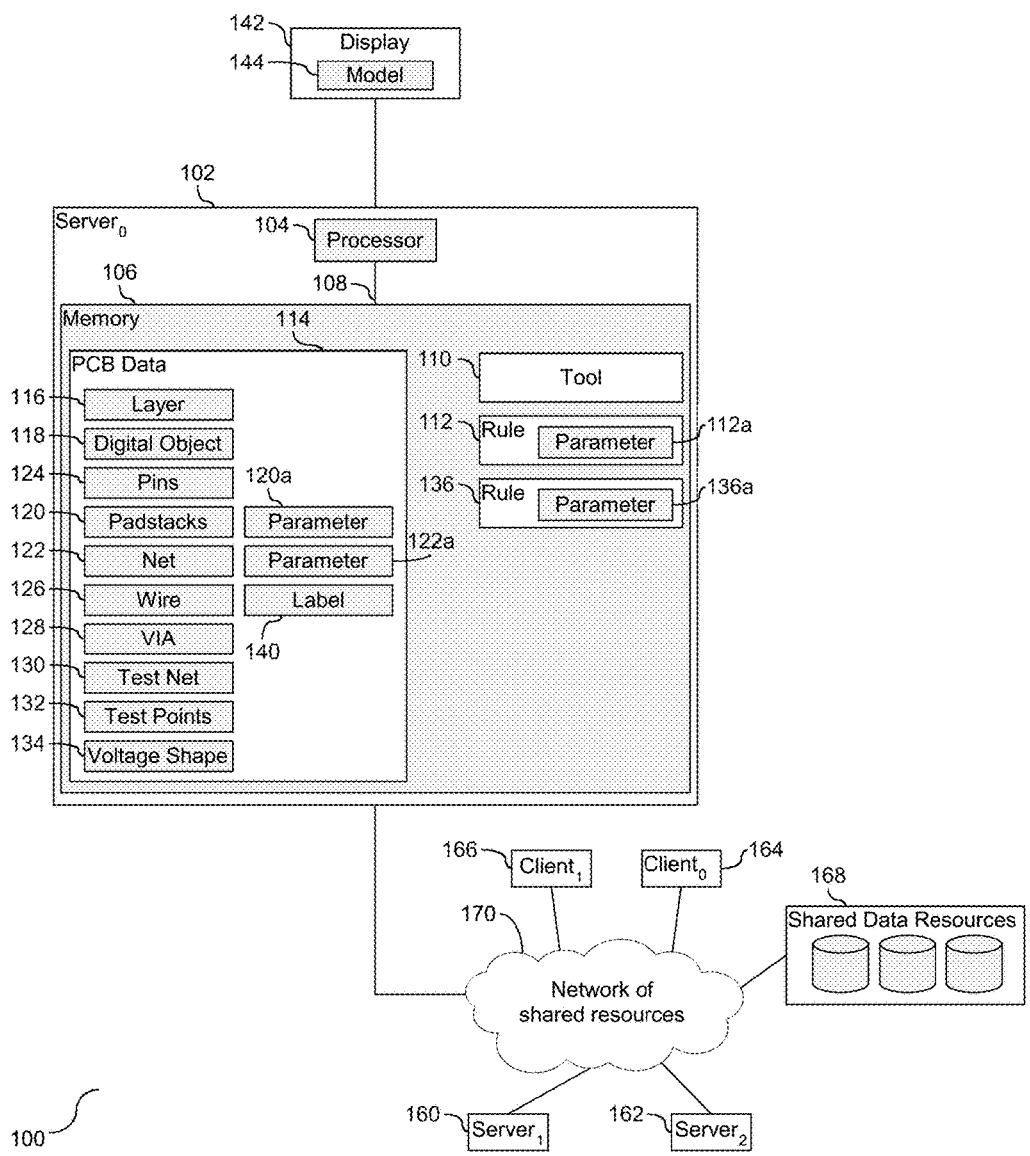
FIG. 1 depicts a block diagram illustrating a computer system for impedance net creation.

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present embodiments. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

After manufacture of a hardware printed circuit board (PCB), wire dimensions (e.g., width and/or thickness) may be directly measured to ensure the manufactured hardware PCB is in accordance with design parameters and manufacturing tolerances. However, it is understood that direct measurement testing procedures are not compatible with mass production of a hardware PCB due to their destructive nature (e.g., cutting the PCB to get a cross section), and/or time consuming nature. The dimensions and/or electrical characteristics of the wire may be measured indirectly through an impedance test, which is understood to be non-destructive. The impedance test determines if the hardware PCB was properly manufactured in accordance with the design parameters and manufacturing tolerances. During and/or after manufacture of the hardware PCB, an impedance test may be executed to determine the impedance of an impedance test net on the hardware PCB. The impedance test net is a net on the PCB that has defined parameter(s) that are optimized for impedance testing. The defined parameters may relate to, but are not limited to, impedance of the net, dimensions of a surface mount pad, dimensions of a vertical interconnect access (VIA), dimensions of a wire in the net, distance between padstacks associated with the impedance test net, distance between a VIA, wire, and/or padstack, and dielectric constant of the net.

It is understood that placement of the impedance test net solely for the impedance test may cause an increase in footprint of the PCB and/or costly and time consuming re-design of the PCB to accommodate the impedance test net. A system, method, and computer program product are disclosed and described herein for dynamic creation of an impedance test net that mitigates time and footprint consumption. A test net on a PCB is dynamically created utilizing a set of rules, including first and second rules. The first rule defines a net parameter, and the second rule defines a padstack geometric parameter. It is understood that the padstack geometric parameter represents physical structure. A first evaluation of one or more nets having a first padstack on the PCB is performed against the first rule. A second evaluation of both the first padstack and an adjacently positioned reference padstack is performed against the second rule. Based on the first and second evaluations, a potential test net having a potential test padstack is dynamically selected from the one or more nets and the selected potential test net is dynamically transformed into the test net. The dynamic transformation includes modifying the potential test padstack and/or the reference padstack in accordance with one or more parameters defined in the second rule. Accordingly, the dynamic creation of the test net improves the efficiency of electronic PCB design by mitigating time and footprint consumption.

Referring to FIG. 1, a block diagram (100) is provided illustrating a computer system and associated tool for impedance test net creation. An impedance test net is hereinafter referred to as a test net. The system is shown with multiple servers, client machines, and shared resources in communication across a network. The quantity of client machines, servers, and data resources shown and described herein are for illustrative purposes and should not be considered limiting. System tools for generating the test net as shown are embedded in server$_0$ (102), although in one embodiment the system tools may be provided on another machine in the network or distributed across two or more machines in the network. In one embodiment, system tools are accessible to other devices through a network connection. For example, server$_0$ (102) is also shown in communication with a network of shared resources (170) across a network connection to access shared resources, including, but not limited to, shared data resources (168), client machines, client$_0$ (164) and client$_1$ (166), and other servers, server$_1$ (160) and server$_2$ (162).

Server$_0$ (102) is shown configured with a processor (104) in communication with a memory (106) across a bus (108). Processor (104) utilizes PCB data (114) to render and/or display a PCB model (144) on a visual display (142) in communication with server$_0$ (102), with the model being a representation of the hardware PCB assembly. The representation of the hardware PCB assembly includes a representation of different components and/or functionality of the hardware PCB assembly. PCB data (114) includes at least one layer (116). In one embodiment, layer (116) is a representation of a layer of the hardware PCB assembly. In one embodiment, layer (116) is an external layer of the hardware PCB assembly. PCB data (114) includes one or more digital objects, such as digital object (118), representing one or more component(s) that will be included in the hardware PCB assembly. Each digital object (118) has a shape and a corresponding electrical connection requirement(s). The electrical connection requirement(s) includes which electrical voltage(s) and/or signal(s) need to be supplied to the digital object (118) by way of wire(s) (126), such that the hardware PCB assembly built from the PCB data (114) will function properly. In one embodiment, the PCB model (144) may be a two-dimensional or a three-dimensional representation of the hardware PCB assembly. Accordingly, PCB data (114) represents the functionality of the hardware PCB assembly.

Pins (124) represent an electrical connection (e.g., surface mount pad, VIA, terminal, solder connection, etc.) within the hardware PCB assembly. Each pin (124) may correspond to a connection to, but is not limited to, the digital object (118), wire (126), VIA (128), and other electrical connection(s). Each pin (124) is associated with a corresponding electrical source and/or signal. Similarly, each pin (124) is associated with a respective net (122), and in one embodiment linked to the respective net (122). Each net (122) describes the connectivity of at least two pins (124) associated with the respective net (122) (e.g., network of connections). During design of the PCB, all pins (124) within the respective net (122) are interconnected by wire(s) (126) while avoiding overlapping with a second wire and/or a second VIA of a second net. The wire (122) is a representation of a conductive trace within a single layer of the hardware PCB assembly. Accordingly, the net (122) describes the connectivity of the pins (124).

Each pin (124) is associated with a padstack (120). The padstack (120) is a representation of a geometric shape and/or dimension(s) of the pin (124) on an external surface of the hardware PCB assembly. In one embodiment, the external surface is on layer (116). In one embodiment, the padstack (120) is a portion of the external surface of the hardware PCB assembly where a component represented by digital object (118) is attached and/or soldered to the hardware PCB assembly. The padstack (120) has one or more associated padstack geometric (PG) parameters (120a). The PG parameters (120a) may be, but are not limited to, a padstack type, a distance of the padstack from a component (e.g., digital object (118)), available PCB area adjacent to the padstack, padstack diameter, anti-pad diameter, distance between an adjacent padstack and the padstack, distance between an adjacent wire and the padstack, padstack depth, and padstack surface shape. The padstack type may be, but is not limited to, a surface mount, a blind hole mount, and a through-hole mount. Available PCB area adjacent to the padstack is space on an external surface of the PCB positioned adjacent to the padstack wherein the space does not contain a wire, pin, padstack, and/or component. The padstack depth may be, but is not limited to, a quantity of layer(s) in the PCB the padstack penetrates, a distance the padstack penetrates into the PCB, a percentage that the padstack penetrates through the PCB (e.g., half-way, and completely through). The padstack surface shape may be a geometric shape of the padstack on an external surface of the PCB. For example, the surface shape may be, but is not limited to, a circle, a triangle, a square, a pentagon, a hexagon, a star, and other shapes. In one embodiment, each padstack (120) may be sized differently depending on a signal carried by the associated net (122). For example, a high speed net may be sized smaller than a power net. Accordingly, each pin has an associated padstack that defines one or more padstack geometric parameters.

As shown, memory (106) is embedded with one or more system tools, such as design tool (110), herein after referred to as the tool (110), to support the creation of PCB data (114) and a test net (130). More specifically, tool (110) may create and/or modify VIA (128), wire (126), digital object (118), voltage shape (134), net (122), pin (124), padstack (120), net parameter (122a), test net (130), test points (132), and layer (116). The tool (110) may interconnect pins (124) associated with net (122). The VIA (128) is a representation of an electrical connection between multiple layers in the hardware PCB assembly. In one embodiment, the VIA (128) may connect to the digital object (118), wire (126), voltage shape (134), and combinations thereof. The voltage shape (134) is a representation of a conductive element having the same voltage within the confines of a boundary. Each voltage shape (134) may supply, but is not limited to, a positive voltage, a negative voltage, and a ground. In one embodiment, the voltage shape (134) may be a different level of the positive, and/or negative voltage. Accordingly, the tool (110) is provided with functionality to modify and/or create PCB data (114).

The designer (110) utilizes net parameters (122a) associated with the net (122) in order to generate and/or modify wire(s) (126) and/or VIA(s) (128) in order to interconnect pins (124) associated with the respective net (122). The net parameter (122a) may be, but is not limited to, wire type, wire dimension, spacing between a wire and a power shape, spacing between the wire and an edge of the PCB, impedance of the wire, line-to-to line spacing, and same net spacing. A wire type may include the material of the wire. The wire dimension, may include a length, width, and/or thickness. Line-to-line spacing may include the spacing of a wire from the net to a wire of another net. Same net spacing may include the spacing of a wire to itself and/or another wire in the identical net. For example, in the case of a serpentine wire the same net spacing may define a minimum and/or maximum radius of each turn. Other wire spacing may define a distance a wire is spaced from another wire, pin, VIA, and/or other element. In one embodiment, each net parameter (122a) may include a permitted range (e.g., a tolerance). Accordingly, the net parameter (122a) includes a plurality of factors that enable the designer (110) to dynamically create and/or modify PCB data (114) which can be used to build the hardware PCB assembly with the functionality required to perform a desired task.

The tool (110) is in communication with rules (112) and (136) in order to dynamically transform a select net from net (122) into a test net (130). Rule (112) defines padstack geometric (PG) parameters (112a) utilized in the creation of test net (130). The PG parameters (112a) may be, but are not limited to, a padstack type, a distance of the padstack from a component (e.g., digital object (118)), available PCB area adjacent to the padstack, padstack diameter, anti-pad diameter, distance between an adjacent padstack and the padstack, distance between an adjacent wire and the padstack, padstack depth, and padstack surface shape. Rule (136) defines net parameters (136a) utilized in the creation of test net (130). The net parameter (136a) may be, but is not limited to, wire type, wire dimension, spacing between a wire and a voltage shape, spacing between the wire and an edge of the PCB, impedance of the wire, line-to-to line spacing, same net spacing, and other wire spacing. In one embodiment, the dimension is a wire length, width, and/or thickness. In one embodiment, the wire dimension is a wire length range. Accordingly, the tool (110) supported by rules (112) and (136) dynamically transforms a select net into test net (130).

To begin the dynamic transformation, designer (110) evaluates one or more nets (122) to determine one or more candidate nets from nets (122) for transformation into a test net (130). The transformation is in accordance with rules (112) and (136). The designer (110) utilizes rule (136) in a first evaluation of the net(s) (122) including an evaluation of the associated pin(s) (124) and padstack(s) (120) of each net. The first evaluation includes an examination of net parameter(s) (122a) associated with net(s) (122) in order to determine which net(s) (122) is in accordance with net parameter(s) (136a) of rule (136) and/or which net(s) (122) can be modified to be in accordance with net parameter(s) (136a). Accordingly, the first evaluation is an evaluation of the compatibility of the select net including associated net parameter(s) (122a) with the net parameter(s) (136a) of rule (136).

The tool (110) utilizes rule (112) in a second evaluation of net(s) (122) including a determination of a reference padstack from padstack(s) (120) which is adjacently positioned to a select padstack of a select net from net(s) (122). In one embodiment, the reference padstack is associated with a reference net from net(s) (122), which is in communication with a ground signal. In one embodiment, the reference padstack is determined based on a distance provided in PG parameter (112*a*), such as a distance between the adjacent reference padstack and the padstack of the select net (122). After determination of the reference padstack from padstack(s) (120), the designer evaluates the padstack(s) (120) associated with each net (122) and the determined reference padstack associated with the net (122) against rule (112), including PG parameter(s) (112*a*). The second evaluation of the net(s) (122) determines which net(s) (122) has padmstack(s) (120) and an associated reference padstack in accordance with PG parameters (112*a*) of rule (112), and/or which nets (122) can be modified to be in accordance with PG parameters (112*a*). In one embodiment, the reference padstack is dynamically created based on available PCB space adjacent to a padstack of the select net. Accordingly, the second evaluation is an evaluation of the compatibility of the padstacks of the select net including associated PG parameters with the PG parameter (112*a*) of rule (112).

Based on the first and second evaluations, the tool (110) selects a potential test net from the net(s) (122). In one embodiment, the selection includes a ranking of the nets (122) based on the first and second evaluations and a selection of the net with the highest ranking. The tool (110) transforms the selected potential test net into a test net (130) by modifying, utilizing rule (112), the geometric shape of at least one of the padstacks (120) associated with the selected potential test net and a reference padstack associated with the selected potential test net. In one embodiment, the transformation includes a modification of one or more PG parameters (120*a*) associated with the padstack (120) of the potential test net and/or one or more PG parameters (120*a*) associated with a reference padstack associated with the potential test net. The modification of each padstack aligns the PG parameter(s) associated with the modified padstack with the PG parameters (112*a*) of rule (112). In one embodiment, a potential test padstack is not found and/or identified and the test net is dynamically created in available space on the PCB in accordance with rules (112) and (136). The order and timing of the first and second evaluations should not be considered limiting. In one embodiment, the first evaluation occurs before the second evaluation. In one embodiment, the second evaluation occurs before the first evaluation. In one embodiment, the first and second evaluations occur simultaneously. Accordingly, a potential test net is selected based on the first and second evaluations and dynamically transformed into the test net.

In one embodiment, the dynamic transformation includes creating two or more impedance test points (132) from at least one of the padstacks (120) associated with the selected potential test net and a reference padstack associated with the selected potential test net. The impedance test points (132) are a representation of portions of the external surface of the hardware PCB that are accessed by an impedance test probe during an impedance test. The impedance test probe is operatively coupled to an impedance testing device (e.g., an oscilloscope) which controls the impedance test and outputs an impedance test result. In one embodiment, PG parameters (112*a*) define geometric clearances that are needed in order for the impedance test probe to access the test points (132) on the hardware PCB assembly with minimal to no interference with a component. The PG parameters (112*a*) may be based on a configuration and/or dimension of the impedance test probe. For example, the PG parameter (112*a*) for available PCB area adjacent to the padstack may be based on the configuration and/or dimension of the test probe to be used in order to provide clearance for the test probe to access test points (132). In another example, the distance between the adjacent padstack and the padstack of the test net may be based on a dimension between two or more test pins on the impedance test probe. In another example, the impedance test probe may have two or more test pins that are in electrical contact with the test points (132) during the impedance test. In one embodiment, a first pin is a ground pin which is in communication with a test point created from a reference padstack and a second pin is a signal pin which is in communication with a test point created from a padstack associated with the test net. The quantity of test pins and configuration of the test pins on the test probe should not be considered limiting. In one embodiment, the PG parameters (112*a*) of rule (112) may be dynamically updated based on selection of an impedance test probe type. Accordingly, the PG parameters (112*a*) of rule (112) are dynamically changed in order to create test points (132) which will be accessible to and communicate with the test probe during the impedance test.

After creation of test net (130), the tool (110) creates and/or dynamically positions one or more labels (140). The labels (140) are automatically created in available space in layer (116) and dynamically positioned adjacent to the test net (130) in one embodiment, a padstack associated with the test net (130). For example, an "R" designating reference may be placed proximal to a reference padstack associated with the test net (130) and an "S" designating signal may be placed proximal to a padstack of the test net (130). In another example, an identifier of the test net (130) may be placed proximal to the test net (130). Accordingly, the labels are created responsive to creation of the test net and dynamically positioned proximal to the test net.

Figure 2A:
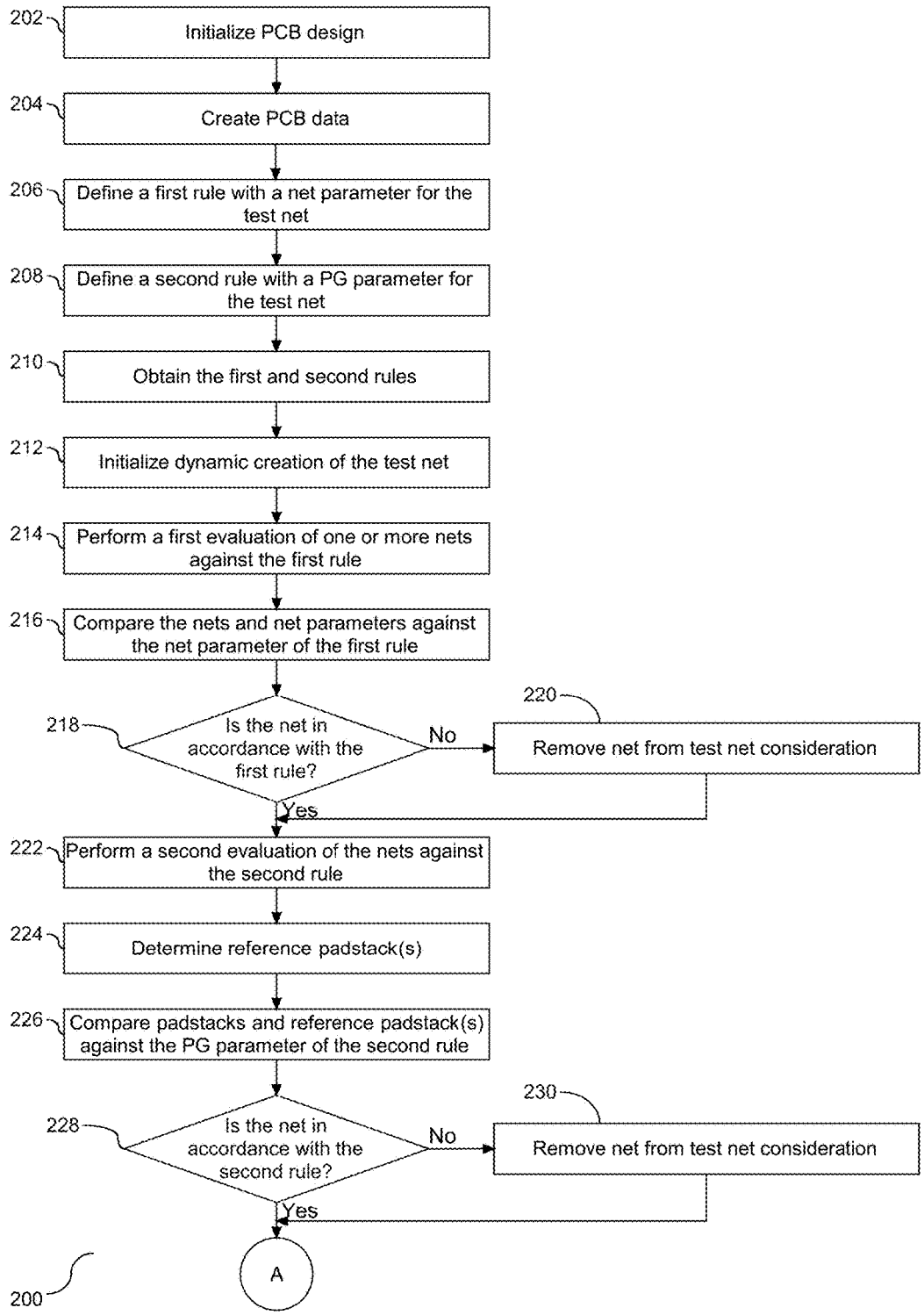
FIGS. 2A-B depict a flow chart illustrating a method for dynamic electronic PCB design.
Figure 2B:
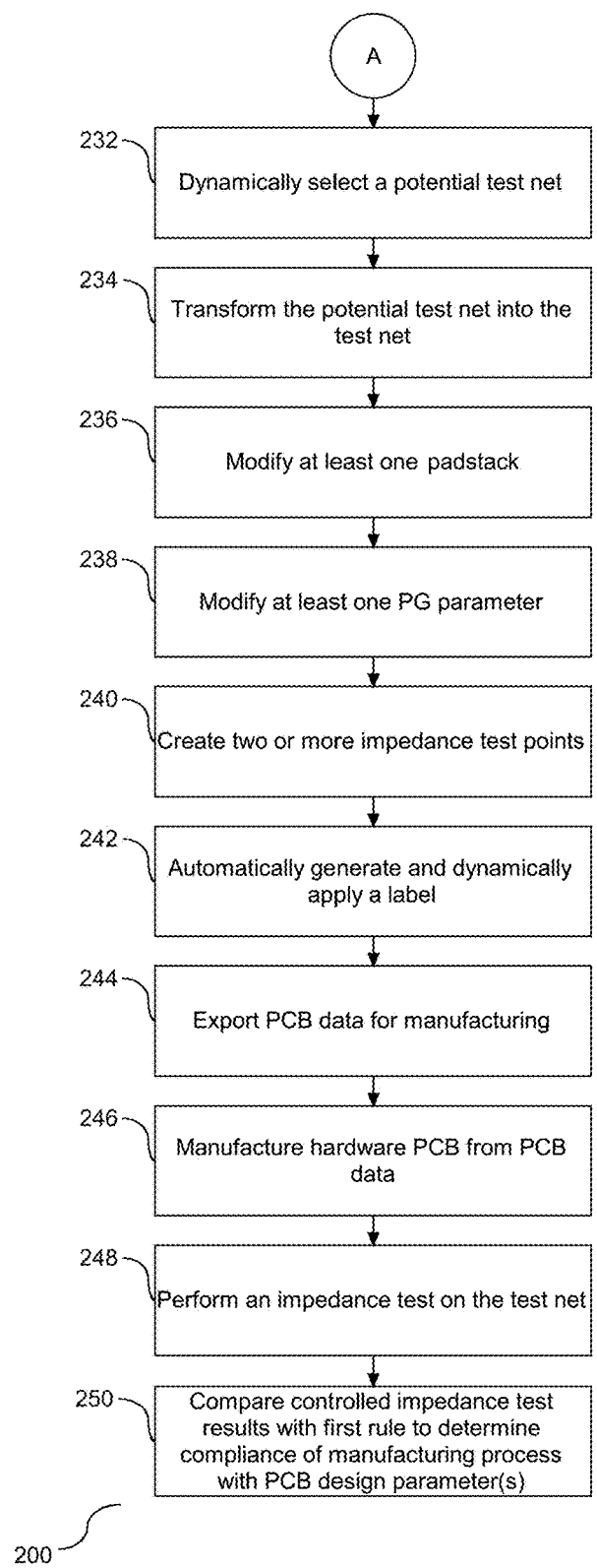

Referring to FIGS. 2A-B, a flow chart (200) is provided illustrating a method for dynamic PCB design utilizing the tools shown and described in FIG. 1. As shown, the PCB design process is initialized (202). The initialization includes defining and/or creating PCB data based on the desired functionality of and/or components to be supported by a hardware PCB assembly (204). The PCB data includes elements which may be, but are not limited to, a digital object, a layer, a VIA, a pin and associated padstack, a wire, a net, and a voltage shape. Each created net is associated with one or more net parameters, and each padstack has one or more associated padstack geometric (PG) parameters. Accordingly, the net parameters of each net and the PG parameters of each padstack are defined.

As shown, a first rule is created to define a net parameter for the test net (206). The net parameter may be, but is not limited to, wire type, wire dimension, spacing between a wire and a voltage shape, spacing between the wire and an edge of the PCB, impedance of the wire, line-to-to line spacing, same net spacing, and other wire spacing. A second rule is created to define PG parameters for the test net (208). The PG parameters may be, but are not limited to, a padstack type, a distance of the padstack from a component, available PCB area adjacent to the padstack, padstack diameter, anti-pad diameter, distance between an adjacent padstack and the padstack, distance between an adjacent wire and the padstack, padstack depth, and padstack surface shape. Accordingly, the first and second rules, each with defined parameters, are created for the test net.

As shown, the created first and second rules are obtained (210) in order to initialize dynamic creation of the test net based on PCB data (212). The dynamic creation includes a first evaluation of the PCB data performed against the first rule (214). The first evaluation includes comparing one or more nets and one or more associated net parameters from PCB data to the first rule, including the net parameters of the first rule (216). The comparison includes a determination of differences and/or similarities between the one or more nets and the first rule. In one embodiment, the comparison includes a determination of whether each net is in accordance with the first rule and/or can be modified to be in accordance with the first rule (218). Following a negative response to the determination at step (218), any net not in accordance with the first rule and/or which cannot be modified to be in accordance with the first rule is removed from test net consideration (220) and the evaluation continues with the remaining nets (222). Accordingly, the nets of the PCB data are evaluated against the first rule, with the evaluation including a comparison of the net parameters of the nets against the net parameters of the first rule.

Following a positive response to the determination at step (218) and following step (220), the dynamic creation includes a second evaluation of the PCB data performed against the second rule (222). The second evaluation includes determining a reference padstack adjacent to a padstack of each net (224) utilizing the second rule. For example, the second rule may include a PG parameter which defines the distance the reference padstack is from the padstack of each net. In one embodiment, the determination at step (224) does not find a reference padstack and a reference padstack is created in available space on an external surface of the PCB. The padstacks of the nets and associated reference padstack(s), including associated PG parameters from PCB data, are compared to the second rule, including the PG parameters of the second rule (226). The comparison at step (226) includes a determination of differences and/or similarities between padstack(s) from the PCB data and the second rule. In one embodiment, the comparison at step (226) includes a determination of whether each padstack is in accordance with the second rule and/or can be modified to be in accordance with the second rule (228). Following a negative response to the determination at step (228), any net without a padstack in accordance with the second rule and/or which cannot be modified to be in accordance with the second rule is removed from test net consideration (230) and the process continues with the remaining nets (232). In one embodiment, the second evaluation only considers the nets remaining after the first evaluation. In one embodiment, the second evaluation occurs prior to the first evaluation and the first evaluation only considers remaining nets after the second evaluation. In one embodiment, the first and second evaluations occur simultaneously and nets are removed based on a combination of both the first and second evaluations. Accordingly, the order of the first and second evaluations should not be considered limiting.

Following a positive response to the determination at step (228) and following step (230), a potential test net is dynamically selected from the evaluated nets based on the first and second evaluations (232). In one embodiment, the selection includes a ranking of the evaluated nets based on the first and second evaluations and a selection of the potential test net from the evaluated nets based on the ranking. In one embodiment, the selection is based on the net with the highest ranking. The selected potential test net is transformed into the test net (234). The transformation is dynamic and includes a modification of a padstack of the test net and/or a reference padstack associated with the test net (236). The modification includes changing the geometric shape of the padstack of the test net and/or reference padstack to comply with the second rule. In one embodiment, the modification includes modifying at least one PG parameter associated with the padstack of the test net and/or a reference padstack associated with the test net (238). In one embodiment, the modification includes creation of two or more impedance test points accessible and configured to receive a test pin from a test probe (240). Accordingly the potential test net, including the test points, is created from the dynamically selected test net.

Following dynamic transformation of the selected potential test net into the test net, in one embodiment, one or more labels are automatically created and positioned adjacent to one or more padstacks in the PCB data (242). The application of one or more labels includes placement of a label proximal to a test point of the test net. For example, in one embodiment, an "S" designating signal may be positioned adjacent to a test point created from a padstack of the test net. In one embodiment, an "R" designating reference may be positioned adjacent to a test point created from a reference padstack. In one embodiment, an identifier of the test net may be placed proximal to the test net. Accordingly, the one or more labels are automatically created responsive to creation of the test net, and the labels dynamically positioned proximal to the test net.

Following step (242), the PCB data is automatically exported in a design file format (e.g., PCB design file) for manufacturing of the hardware PCB assembly (244). The hardware PCB is manufactured from the exported design file (246) and an impedance test is performed on the hardware PCB including the test net (248). The impedance test includes providing an impedance test probe in communication with a signal test point and a reference test point. The impedance test probe, in communication with an impedance test device, is utilized to measure a signal in the test net. The measurement includes a determination of impedance of the signal through the test net. The result(s) of the impedance test is compared with the first rule in order to determine if the hardware PCB has been manufactured in accordance with the design parameter(s) (250). Accordingly, a net is dynamically transformed into the test net in order to provide functionality in the hardware PCB to accommodate the impedance test net with a minimal impact on the footprint of the hardware PCB and the time required to design the hardware PCB.

Figure 3:
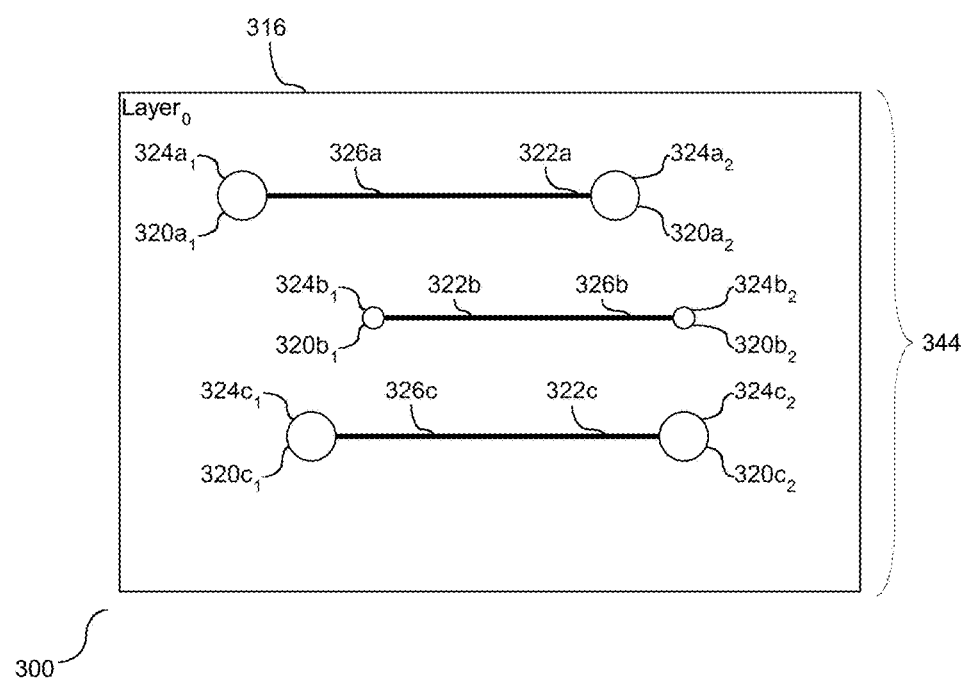
FIG. 3 depicts a block diagram illustrating a virtual representation of a hardware PCB assembly prepared for test net creation.

The dynamic creation of the test net increases efficiency in the design of a hardware PCB assembly. FIG. 1 illustrated a computer system for dynamic test net creation and FIGS. 2A-B illustrates a method for dynamic test net creation. Referring to FIG. 3, a block diagram (300) is provided illustrating a representation of a hardware PCB assembly prepared for dynamic test net creation. A PCB model (344) is shown as having a first external layer, layer$_0$ (316). The PCB model (344) includes nets (322$a$), (322$b$), and (322$c$). Each net, (322$a$), (322$b$), and (322$c$) is provided with pins, (324$a_1$) and (324$a_2$), (324$b_1$) and (324$b_2$), and (324$c_1$) and (324$c_2$), respectively. Each pin, (324$a_1$), (324$a_2$), (324$b_1$), (324$b_2$), (3240, and (324$c_2$) has an associated padstack, (320$a_1$), (320$a_2$), (320$b_1$), (320$b_2$), (3200, and (320$c_2$), respectively. Pin (324$a_1$) is connected to pin (324$a_2$) by wire (326$a$). Similarly, pin (324$b_1$) is connected to pin (324$b_2$) by wire (326$b$) and pin (324$c_1$) is connected to pin (324$c_2$) by wire (326$c$). The quantity of layers, pins, nets, wires, and padstacks is for illustration purposes only and should not be considered limiting. Net (322$c$) is dynamically selected as a potential test net responsive to a first evaluation of net (322$c$) against first rule (136) and net parameters (136$a$) and a second evaluation of net ($322c$) against second rule ($112$) and PG parameters ($112a$). Responsive to the selection, net ($322c$) is dynamically transformed into test net ($430c$).

Figure 4:
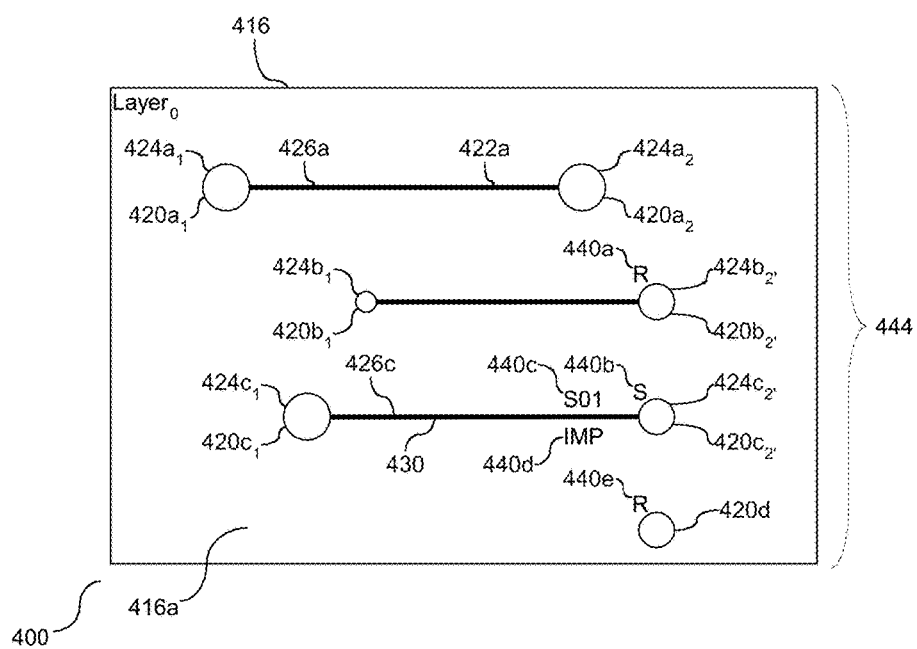
FIG. 4 depicts a block diagram illustrating an embodiment of a virtual representation of the hardware PCB assembly with a dynamically created test net.

Referring to FIG. 4, a block diagram ($400$) is provided illustrating an embodiment of a virtual representation of the hardware PCB assembly with a dynamically created test net. A PCB model ($444$) is shown as having a first external layer, layer$_0$ ($416$). The PCB model ($444$) includes nets ($422a$), and ($422b$), and test net ($430$). Each net, ($422a$), and ($422b$), is provided with pins, ($424a_1$) and ($424a_2$), and ($424b_1$) and ($424b_2$) respectively. Each pin, ($424a_1$), ($424a_2$), ($424b_1$), and ($424b_2$) has an associated padstack, ($420a_1$), ($420a_2$), ($420b_1$), and ($420b_2$), respectively. Pin ($424a_1$) is connected to pin ($424a_2$) by wire ($426a$). Similarly, pin ($424b_1$) is connected to pin ($424b_2$) by wire ($426b$). The quantity of layers, pins, nets, wires, and padstacks is for illustration purposes only and should not be considered limiting.

Test net ($430$) is provided with pins, ($424c_1$) and ($424c_{2'}$). Pin ($424c_1$) is connected to pin ($424c_{2'}$) by wire ($426a$). Padstack ($320b_2$) is associated with test net ($430$) utilizing the second rule ($112$) and designated as a reference padstack ($420b_{2'}$). The dynamic transformation of net ($322c$) into test net ($430$) includes modifying pin ($324c_2$). The modification of the pin ($342_{c2}$) includes modifying padstack ($320_{c2}$) to dynamically create pin ($424c_{2'}$) including creating padstack ($424c_{2'}$). Pin ($424c_{2'}$) is designated at the signal pin. In one embodiment, the dynamic transformation includes modifying pin ($324b_2$) including modifying padstack ($320b_2$) to dynamically create pin ($424b_{2'}$) including creating padstack ($420b_{2'}$). The modification of pins ($324c_2$) and ($324b_2$) is based on the second rule ($112$) and PG parameters ($112a$). In one embodiment, the dynamic transformation includes dynamically creating reference padstack ($420d$) in accordance with the second rule ($112$) and PG parameters ($112a$) and associating reference padstack ($420d$) with test net ($430$). In one embodiment, padstack ($420b_{2'}$) and ($420c_{2'}$) are dynamically transformed into test points. Accordingly, net ($322c$) of FIG. 3 is dynamically selected as the potential test net and dynamically transformed into test net ($430$) of FIG. 4 utilizing the first and second rules ($136$) and ($112$), respectively.

Responsive to the dynamic transformation, one or more labels are automatically generated. For example, label ($440a$) is automatically created and dynamically positioned proximal to padstack ($420b_{2'}$) and embedded in an external surface ($416a$) of layer ($416$). Similarly, label ($440b$) is automatically created and dynamically positioned proximal to padstack ($420c_{2'}$), and label ($440e$) is automatically created and dynamically positioned proximal to padstack ($420d$). Both label ($440b$) and label ($440e$) are embedded in an external surface ($416a$) of layer ($416$). In another example, label ($440c$) is automatically created and dynamically positioned proximal to test net ($430$) and embedded in an external surface ($416a$) of layer ($416$). Similarly, label ($440d$) is automatically created and dynamically positioned proximal to test net ($430$) and embedded in an external surface ($416a$) of layer ($416$). Label ($440a$) designates that padstack ($420b_{2'}$) is a reference padstack. Similarly, label ($440b$) designates padstack ($420c_{2'}$) is a signal padstack and label ($440e$) designates padstack ($420d$) is a reference padstack. In another example, label ($440c$) designates the identifier of test net ($430$). Similarly, label ($440d$) designates test net ($430$) as the net to be used for impedance testing. Accordingly, labels are automatically created and positioned proximal to test net ($430$).

Aspects of dynamic creation of a test net shown in FIGS. 1-4, employ one or more functional tools to support use of the generated boundary. Aspects of the functional tool, e.g. designer, and its associated functionality may be embodied in a computer system/server in a single location, or in one embodiment, may be configured in a cloud based system sharing computing resources. With references to FIG. 5, a block diagram ($500$) is provided illustrating an example of a computer system/server ($502$), hereinafter referred to as a host ($502$) in communication with a cloud based support system, to implement the processes described above with respect to FIGS. 1-4. Host ($502$) is operational with numerous other general purpose or special purpose computing system environments or configurations. Examples of well-known computing systems, environments, and/or configurations that may be suitable for use with host ($502$) include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and file systems (e.g., distributed storage environments and distributed cloud computing environments) that include any of the above systems, devices, and their equivalents.

Host ($502$) may be described in the general context of computer system-executable instructions, such as program modules, being executed by a computer system. Generally, program modules may include routines, programs, objects, components, logic, data structures, and so on that perform particular tasks or implement particular abstract data types. Host ($502$) may be practiced in distributed cloud computing environments where tasks are performed by remote processing devices that are linked through a communications network. In a distributed cloud computing environment, program modules may be located in both local and remote computer system storage media including memory storage devices.

Figure 5:
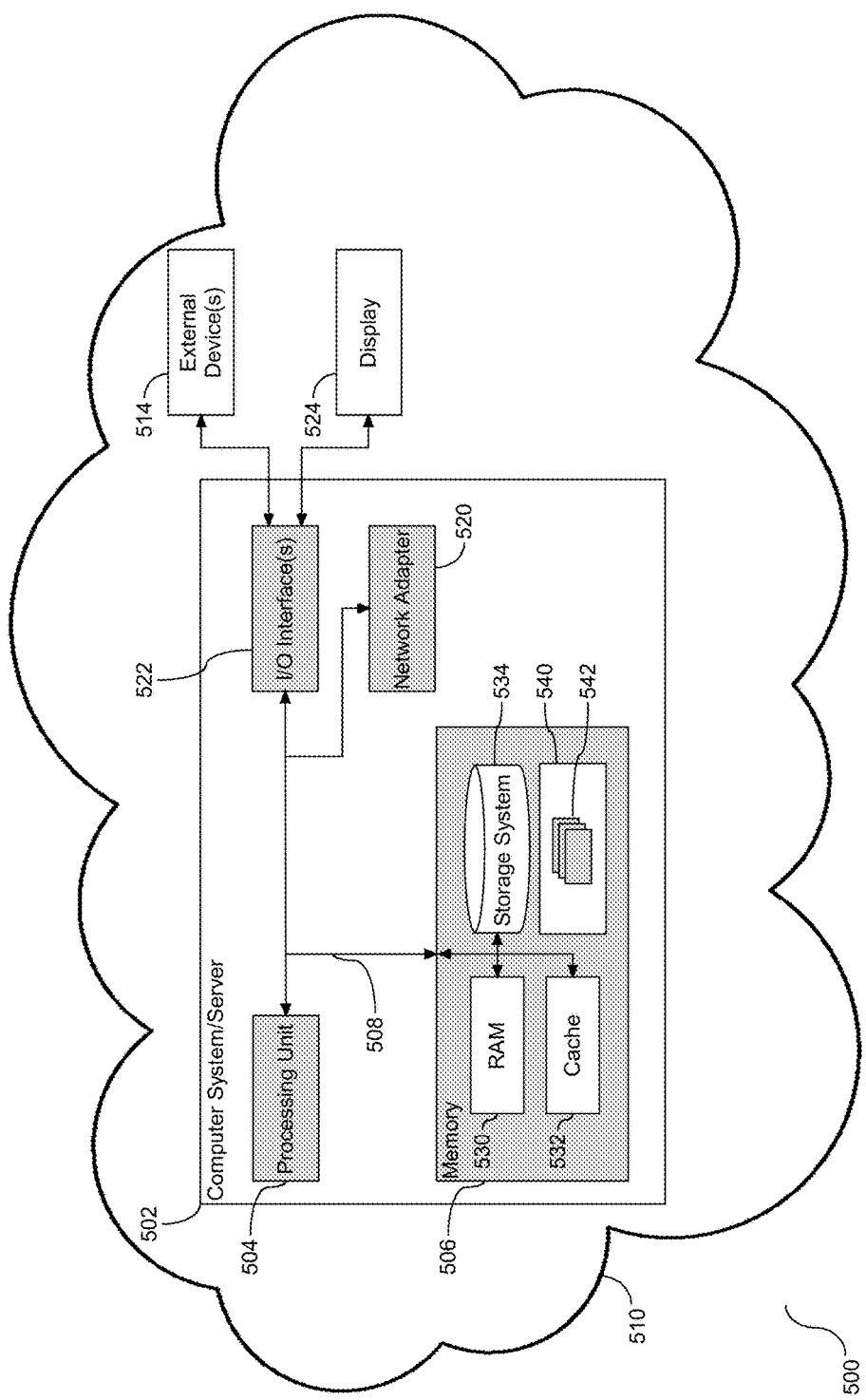
FIG. 5 is a block diagram illustrating an example of a computer system/server of a cloud based support system, to implement the process described above with respect to FIGS. 1-4.

As shown in FIG. 5, host ($502$) is shown in the form of a general-purpose computing device. The components of host ($502$) may include, but are not limited to, one or more processors or processing units ($504$), a system memory ($506$), and a bus ($508$) that couples various system components including system memory ($506$) to processor ($504$). Bus ($508$) represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Host ($502$) typically includes a variety of computer system readable media. Such media may be any available media that is accessible by host ($502$) and it includes both volatile and non-volatile media, removable and non-removable media.

Memory ($506$) can include computer system readable media in the form of volatile memory, such as random access memory (RAM) ($530$) and/or cache memory ($532$). By way of example only, storage system ($534$) can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus (508) by one or more data media interfaces.

Program/utility (540), having a set (at least one) of program modules (542), may be stored in memory (506) by way of example, and not limitation, as well as an operating system, one or more application programs, other program modules, and program data. Each of the operating systems, one or more application programs, other program modules, and program data or some combination thereof, may include an implementation of a networking environment. Program modules (542) generally carry out the functions and/or methodologies of embodiments to store and analyze data. For example, the set of program modules (542) may include the modules configured as a tool in order to dynamically create an impedance test net as described in FIGS. 1-4.

Host (502) may also communicate with one or more external devices (514), such as a keyboard, a pointing device, etc.; a display (524); one or more devices that enable a user to interact with host (502); and/or any devices (e.g., network card, modem, etc.) that enable host (502) to communicate with one or more other computing devices. Such communication can occur via Input/Output (I/O) interface(s) (522). Still yet, host (502) can communicate with one or more networks such as a local area network (LAN), a general wide area network (WAN), and/or a public network (e.g., the Internet) via network adapter (520). As depicted, network adapter (520) communicates with the other components of host (502) via bus (508). In one embodiment, a plurality of nodes of a distributed file system (not shown) is in communication with the host (502) via the I/O interface (522) or via the network adapter (520). It should be understood that although not shown, other hardware and/or software components could be used in conjunction with host (502). Examples, include, but are not limited to: microcode, device drivers, redundant processing units, external disk drive arrays, RAID systems, tape drives, and data archival storage systems, etc.

In this document, the terms "computer program medium," "computer usable medium," and "computer readable medium" are used to generally refer to media such as main memory (506), including RAM (530), cache (532), and storage system (534), such as a removable storage drive and a hard disk installed in a hard disk drive.

Computer programs (also called computer control logic) are stored in memory (506). Computer programs may also be received via a communication interface, such as network adapter (520). Such computer programs, when run, enable the computer system to perform the features of the present embodiments as discussed herein. In particular, the computer programs, when run, enable the processing unit (504) to perform the features of the computer system. Accordingly, such computer programs represent controllers of the computer system.

In one embodiment, host (502) is a node (510) of a cloud computing environment. As is known in the art, cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models. Example of such characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher layer of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some layer of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Figure 6:
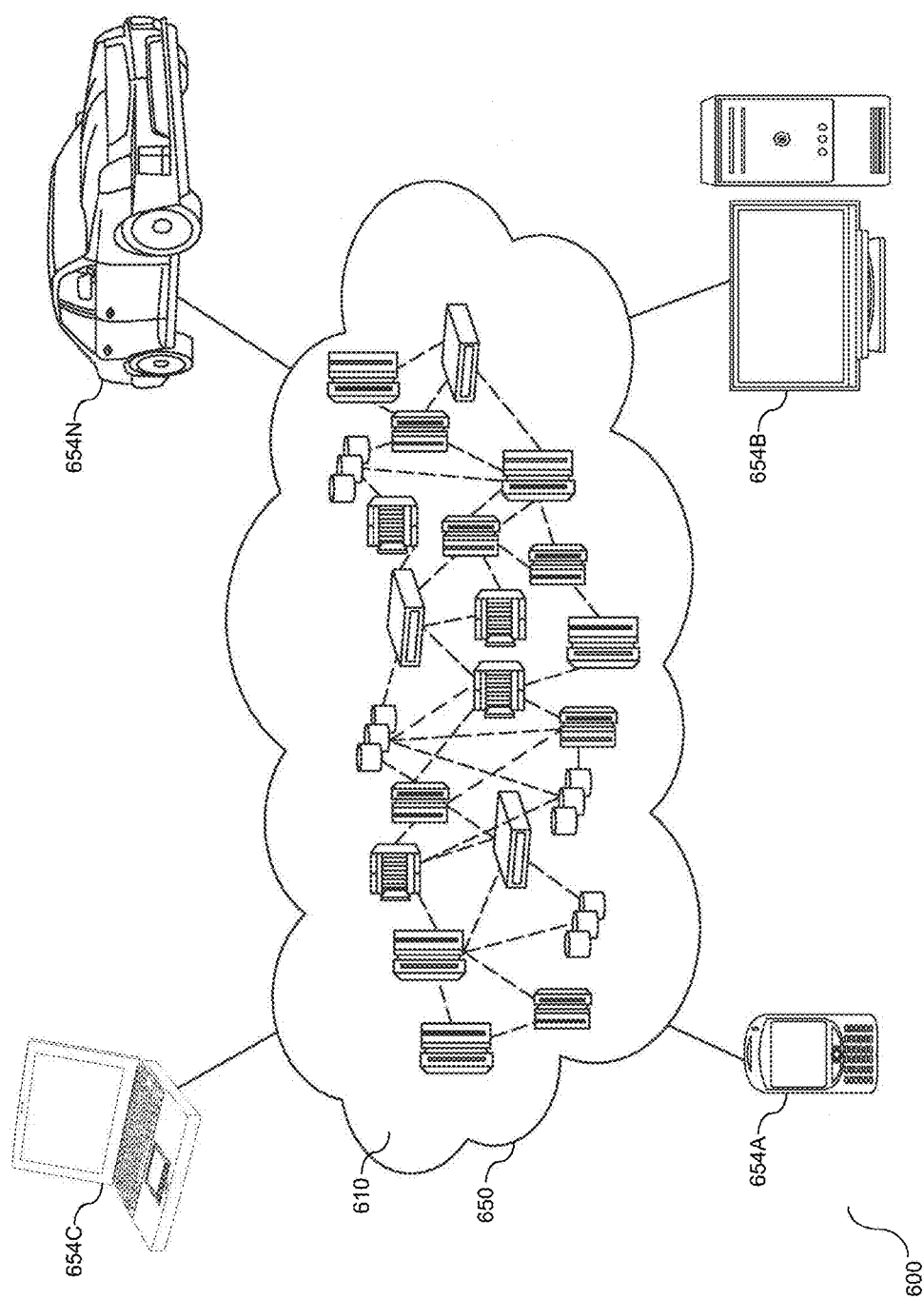
FIG. 6 depicts a block diagram illustrating a cloud computer environment.

Referring now to FIG. 6, an illustrative cloud computing network (600). As shown, cloud computing network (600) includes a cloud computing environment (650) having one or more cloud computing nodes (610) with which local computing devices used by cloud consumers may communicate. Examples of these local computing devices include, but are not limited to, personal digital assistant (PDA) or cellular telephone (654A), desktop computer (654B), laptop computer (654C), and/or automobile computer system (654N). Individual nodes within nodes (610) may further communicate with one another. They may be grouped (not shown) physically or virtually, in one or more networks, such as Private, Community, Public, or Hybrid clouds as described hereinabove, or a combination thereof. This allows cloud computing environment (600) to offer infrastructure, platforms and/or software as services for which a cloud consumer does not need to maintain resources on a local computing device. It is understood that the types of computing devices (654A-N) shown in FIG. 6 are intended to be illustrative only and that the cloud computing environment (650) can communicate with any type of computerized device over any type of network and/or network addressable connection (e.g., using a web browser).

Figure 7:
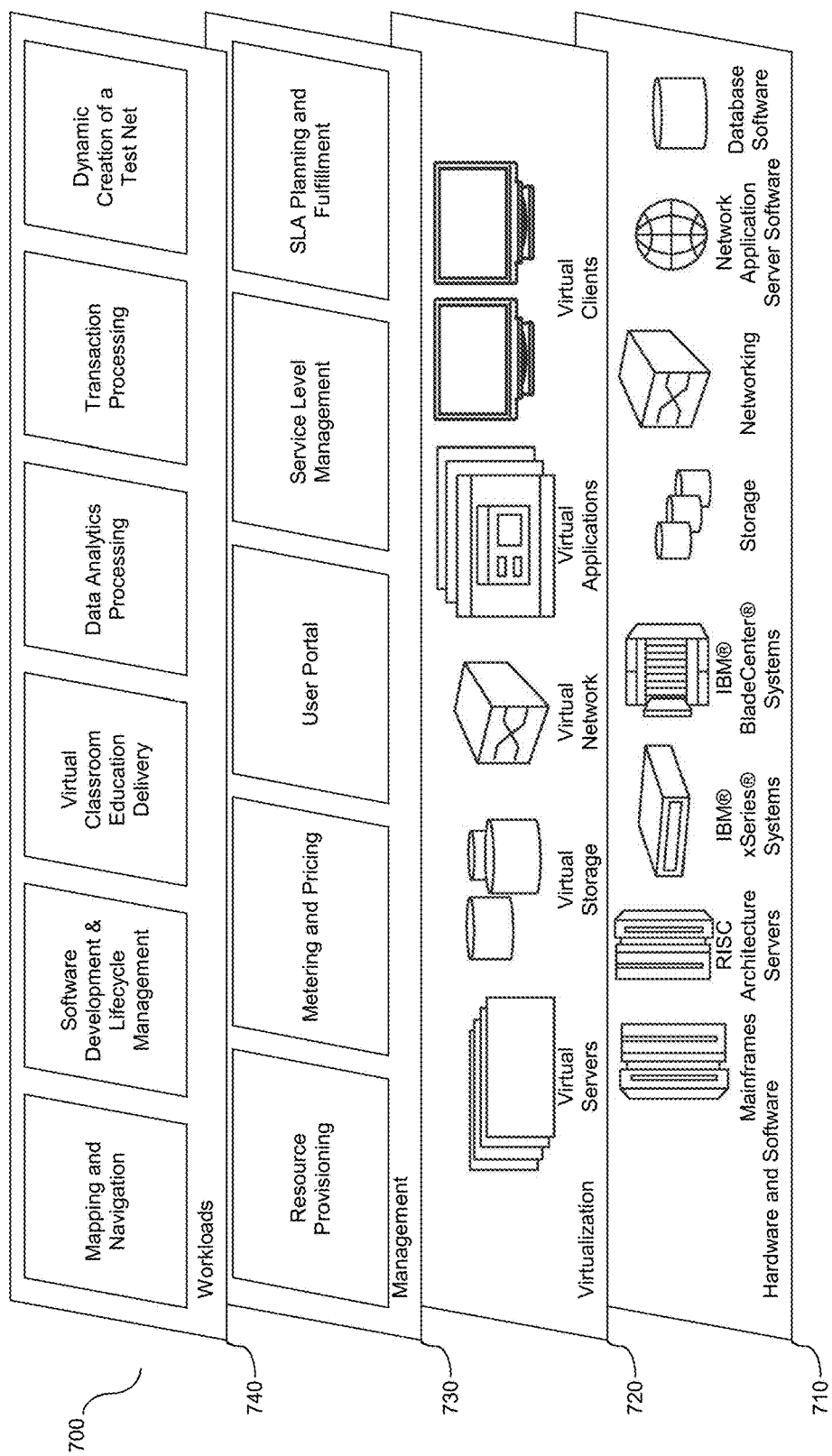
FIG. 7 depicts a block diagram illustrating a set of functional abstraction model layers provided by the cloud computing environment.

Referring now to FIG. 7, a set of functional abstraction layers (700) provided by the cloud computing network of FIG. 6 is shown. It should be understood in advance that the components, layers, and functions shown in FIG. 7 are intended to be illustrative only, and the embodiments are not limited thereto. As depicted, the following layers and corresponding functions are provided: hardware and software layer (710), virtualization layer (720), management layer (730), and workload layer (740). The hardware and software layer (710) includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer (720) provides an abstraction layer from which the following examples of virtual entities may be provided: virtual servers; virtual storage; virtual networks, including virtual private networks; virtual applications and operating systems; and virtual clients.

In one example, management layer (730) may provide the following functions: resource provisioning, metering and pricing, user portal, service layer management, and SLA planning and fulfillment. Resource provisioning provides dynamic procurement of computing resources and other resources that are utilized to perform tasks within the cloud computing environment. Metering and pricing provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service layer management provides cloud computing resource allocation and management such that required service layers are met. Service Layer Agreement (SLA) planning and fulfillment provides pre-arrangement for, and procurement of, cloud computing resources for which a future requirement is anticipated in accordance with an SLA.

Workloads layer (740) provides examples of functionality for which the cloud computing environment may be utilized. Examples of workloads and functions which may be provided from this layer include, but are not limited to: mapping and navigation; software development and lifecycle management; virtual classroom education delivery; data analytics processing; transaction processing; and dynamic creation of a test net.

The present embodiments may be a system, a method, and/or a computer program product. The computer program product may include a computer readable storage medium (or media) having computer readable program instructions thereon for causing a processor to carry out aspects of the present embodiments.

The computer readable storage medium can be a tangible device (e.g., computer readable storage device) that can retain and store instructions for use by an instruction execution device. The computer readable storage medium may be, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium and a computer readable storage device, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

A computer readable signal medium includes a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium is any computer readable medium that is not a computer readable storage medium and that can communicate, propagate, or transport a program for use by or in connection with an instruction execution system, apparatus, or device.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present embodiments.

As will be appreciated by one skilled in the art, the aspects may be embodied as a system, method, or computer program product. Accordingly, the aspects may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, the aspects described herein may take the form of a computer program product embodied in one or more computer readable medium(s) having computer readable program code embodied thereon.

The flow charts and block diagrams in the Figures illustrate the architecture, functionality, and operation of possible implementations of systems, methods, and computer program products according to various embodiments. In this regard, each block in the flow charts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flow chart illustration(s), and combinations of blocks in the block diagrams and/or flow chart illustration(s), can be implemented by special purpose hardware-based systems that perform the specified functions or acts, or combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Indeed, executable code could be a single instruction, or many instructions, and may even be distributed over several different code segments, among different applications, and across several memory devices. Similarly, operational data may be identified and illustrated herein within the tool, and may be embodied in any suitable form and organized within any suitable type of data structure. The operational data may be collected as a single dataset, or may be distributed over different locations including over different storage devices, and may exist, at least partially, as electronic signals on a system or network.

Furthermore, the described features, structures, or characteristics may be combined in any suitable manner in one or more embodiments. In the following description, numerous specific details are provided, such as examples of agents, to provide a thorough understanding of the disclosed embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiments.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the embodiments for various embodiments with various modifications as are suited to the particular use contemplated. Creation of a boundary based on a voltage split optimizing route placement during PCB design thereby limiting electromagnetic incompatibility, signal degradation, and/or increased bit error rates.

It will be appreciated that, although specific embodiments have been described herein for purposes of illustration, various modifications may be made without departing from the spirit and scope of the embodiments. In particular, the quantity of components, boundaries, VIAs, wires, and nets should not be considered limiting. Additionally, the dynamic creation of a test net may utilize a plurality of different padstacks. Accordingly, the scope of protection of these embodiments is limited only by the following claims and their equivalents.

What is claimed is:

1. A computer system comprising:
   a processing unit in communication with a memory; and
   a functional unit in communication with the processing unit having a designer to perform dynamic electronic printed circuit board (PCB) design, the designer to:
      obtain a first rule that defines a net parameter and a second rule that defines a padstack geometric parameter;
      dynamically create a test net on a PCB utilizing the first and second rules, including:
         perform a first evaluation of one or more nets on the PCB against the first rule, each net having a first padstack;
         determine a reference padstack adjacently positioned to the first padstack;
         perform a second evaluation of both the first padstack and the reference padstack against the second rule; and
         dynamically select a potential test net having a potential test padstack from the one or more nets, the selection based on the first and second evaluations;
      dynamically transform the selected potential test net into the test net, including modify at least one of the potential test padstack and the reference padstack utilizing the second rule; and
      manufacture a hardware PCB assembly from a file corresponding to the PCB design.

2. The system of claim 1, wherein dynamically transform the selected potential net further comprises the designer to:
   create two or more impedance test points on the PCB from the potential test padstack and the reference padstack, wherein the impedance test points are accessible by a test probe.

3. The system of claim 1, wherein the net parameter is selected from the group consisting of: wire type, wire width, spacing between a wire and a power shape, spacing between the wire and the edge of the PCB, impedance of the wire, line-to-line spacing, and same net spacing.

4. The system of claim 1, wherein the padstack geometric parameter is selected from the group consisting of: padstack type, distance of the padstack from a component, available PCB area adjacent to the padstack, padstack diameter, anti-pad diameter, distance between an adjacent padstack and the padstack, distance between an adjacent wire and the padstack, padstack depth, and padstack surface shape.

5. The system of claim 4, wherein modify the at least one of the potential test padstack and the reference padstack utilizing the second rule further comprises the designer to:
   modify one or more padstack geometric parameters associated with at least one of the potential test padstack and the reference padstack utilizing the second rule.

6. The system of claim 1, further comprising the designer to:
   automatically generate a label for an item selected from the group consisting of: the reference padstack, a test padstack of the test net, and the test net; and
   dynamically apply the label to a location on the PCB proximally positioned to the test net.

7. A computer program product for electronic printed circuit board (PCB) design, the computer program product comprising a computer readable storage device having program code embodied therewith, the program code executable by a processor to:
   obtain a first rule that defines a net parameter and a second rule that defines a padstack geometric parameter;
   dynamically create a test net on a PCB utilizing the first and second rules, including:
      perform a first evaluation of one or more nets on the PCB against the first rule, each net having a first padstack;
      determine a reference padstack adjacently positioned to the first padstack;
      perform a second evaluation of both the first padstack and the reference padstack against the second rule; and
      dynamically select a potential test net having a potential test padstack from the one or more nets, the selection based on the first and second evaluations;
   dynamically transform the selected potential test net into the test net, including modify at least one of the potential test padstack and the reference padstack utilizing the second rule; and
   manufacture a hardware PCB assembly from a file corresponding to the PCB design.

8. The computer program product of claim 7, wherein dynamically transform the selected potential net further comprises program code to:
   create two or more impedance test points on the PCB from the potential test padstack and the reference padstack, wherein the impedance test points are accessible by a test probe.

9. The computer program product of claim 7, wherein the net parameter is selected from the group consisting of: wire type, wire width, spacing between a wire and a power shape, spacing between the wire and the edge of the PCB, impedance of the wire, line-to-line spacing, and same net spacing.

10. The computer program product of claim 7, wherein the padstack geometric parameter is selected from the group consisting of: padstack type, distance of the padstack from a component, available PCB area adjacent to the padstack, padstack diameter, anti-pad diameter, distance between an adjacent padstack and the padstack, distance between an adjacent wire and the padstack, padstack depth, and padstack surface shape.

11. The computer program product of claim 10, wherein modify the at least one of the potential test padstack and the reference padstack utilizing the second rule further comprises program code to:
   modify one or more padstack geometric parameters associated with at least one of the potential test padstack and the reference padstack utilizing the second rule.

12. The computer program product of claim 7, further comprising program code to:
   automatically generate a label for an item selected from the group consisting of: the reference padstack, a test padstack of the test net, and the test net; and
   dynamically apply the label to a location on the PCB proximally positioned to the test net.

13. A method for dynamic electronic printed circuit board (PCB) design comprising:

obtaining a first rule that defines a net parameter and a second rule that defines a padstack geometric parameter;

dynamically creating a test net on a PCB utilizing the first and second rules, including:

performing a first evaluation of one or more nets on the PCB against the first rule, each net having a first padstack;

determining a reference padstack adjacently positioned to the first padstack;

performing a second evaluation of both the first padstack and the reference padstack against the second rule; and dynamically selecting a potential test net having a potential test padstack from the one or more nets, the selection based on the first and second evaluations;

dynamically transforming the selected potential test net into the test net, including modifying at least one of the potential test padstack and the reference padstack utilizing the second rule; and manufacturing a hardware PCB assembly from a file corresponding to the PCB design.

14. The method of claim 13, wherein dynamically transforming the selected potential net further comprises:

creating two or more impedance test points on the PCB from the potential test padstack and the reference padstack, wherein the impedance test points are accessible by a test probe.

15. The method of claim 13, wherein the net parameter is selected from the group consisting of: wire type, wire width, spacing between a wire and a power shape, spacing between the wire and the edge of the PCB, impedance of the wire, line-to-line spacing, and same net spacing.

16. The method of claim 13, wherein the padstack geometric parameter is selected from the group consisting of: padstack type, distance of the padstack from a component, available PCB area adjacent to the padstack, padstack diameter, anti-pad diameter, distance between an adjacent padstack and the padstack, distance between an adjacent wire and the padstack, padstack depth, and padstack surface shape.

17. The method of claim 16, wherein modifying the at least one of the potential test padstack and the reference padstack utilizing the second rule further comprises:

modifying one or more padstack geometric parameters associated with at least one of the potential test padstack and the reference padstack utilizing the second rule.

18. The method of claim 13, further comprising:

automatically generating a label for an item selected from the group consisting of: the reference padstack, a test padstack of the test net, and the test net; and dynamically applying the label to a location on the PCB proximally positioned to the test net.

* * * * *